(12) United States Patent
Spence et al.

(10) Patent No.: US 7,027,130 B2
(45) Date of Patent: Apr. 11, 2006

(54) DEVICE AND METHOD FOR DETERMINING AN ILLUMINATION INTENSITY PROFILE OF AN ILLUMINATOR FOR A LITHOGRAPHY SYSTEM

(75) Inventors: Christopher A. Spence, Sunnyvale, CA (US); Todd P. Lukanc, San Jose, CA (US); Luigi Capodieci, Santa Cruz, CA (US); Joerg Reiss, Sunnyvale, CA (US); Sarah N. McGowan, San Francisco, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 170 days.

(21) Appl. No.: 10/833,651

(22) Filed: Apr. 28, 2004

(65) Prior Publication Data

US 2005/0243299 A1    Nov. 3, 2005

(51) Int. Cl.
*G03B 27/72* (2006.01)
(52) U.S. Cl. ........................................... 355/69
(58) Field of Classification Search ................ 355/69
See application file for complete search history.

(56) References Cited

U.S. PATENT DOCUMENTS

| | | | | |
|---|---|---|---|---|
| 5,757,425 A | * | 5/1998 | Barton et al. | 348/241 |
| 5,863,712 A | * | 1/1999 | Von Bunau et al. | 430/396 |
| 6,091,492 A | * | 7/2000 | Strickland et al. | 356/336 |
| 6,515,272 B1 | | 2/2003 | Fontaine et al. | |
| 6,618,185 B1 | * | 9/2003 | Sandstrom | 359/292 |
| 2002/0126267 A1 | * | 9/2002 | Smith | 355/67 |
| 2005/0168498 A1 | * | 8/2005 | Granik | 345/698 |

OTHER PUBLICATIONS

Brunner, T.A., Impact of Lens Aberrations on Optical Lithography. vol. 41, No. 1/2, Optical Lithography [online] 1997 [retrieved Nov. 24, 2003]. Retrieved from the Internet: URL: http://www.research.ibm.com/journal/rd/411/brunner.html.

* cited by examiner

*Primary Examiner*—Michael Tokar
*Assistant Examiner*—Vivian Nelson
(74) *Attorney, Agent, or Firm*—Renner, Otto, Boisselle & Sklar, LLP

(57) ABSTRACT

A system and method for generating an illumination intensity profile of an illuminator that forms part of a projection lithography system. Radiation from the illuminator is projected towards an illumination profile mask having a plurality of apertures such that each aperture passes a distinct portion of the radiation. The intensity of each of the distinct portions of radiation is detected and assembled to form the illumination intensity profile.

20 Claims, 3 Drawing Sheets

DEVICE AND METHOD FOR DETERMINING AN ILLUMINATION INTENSITY PROFILE OF AN ILLUMINATOR FOR A LITHOGRAPHY SYSTEM

TECHNICAL FIELD

The present invention relates generally to the field of integrated circuit manufacture and, more particularly, to a device and method for characterizing an illumination intensity profile of an illuminator, such as an illuminator that forms a part of an optical lithography system used in the production of integrated circuits.

BACKGROUND

The formation of various integrated circuit (IC) structures on a wafer often relies on lithographic processes, sometimes referred to as photolithography, or simply lithography. As is well known, lithographic processes can be used to transfer a pattern of a photomask (also referred to herein as a mask or a reticle) to a wafer.

For instance, patterns can be formed from a photo resist layer disposed on the wafer by passing light energy through a photomask having an arrangement to image the desired pattern onto the photo resist layer. As a result, the pattern is transferred to the photo resist layer. In areas where the photo resist is sufficiently exposed and after a development cycle, the photo resist material can become soluble such that it can be removed to selectively expose an underlying layer (e.g., a semiconductor layer, a metal or metal containing layer, a dielectric layer, a hard mask layer, etc.). Portions of the photo resist layer not exposed to a threshold amount of light energy will not be removed and serve to protect the underlying layer during further processing of the wafer (e.g., etching exposed portions of the underlying layer, implanting ions into the wafer, etc.). Thereafter, the remaining portions of the photo resist layer can be removed.

There is a pervasive trend in the art of IC fabrication to increase the density with which various structures are arranged. For example, feature size, line width, and the separation between features and lines are becoming increasingly smaller. For example, nodes with a critical dimension of about 45 nanometers (nm) to about 65 nm have been proposed.

In these sub-micron processes, yield is affected by factors such as optical proximity effects and photo resist processing. Characteristics of the equipment used to image the desired pattern onto the photo resist can also play a large role in image fidelity and the quality of the resulting integrated circuit. Therefore, it may desirable to characterize or otherwise quantify the performance of lithography equipment. Currently, resist images are used to quantify characteristics of lithography equipment. However, this technique is relatively imprecise and cannot be effectively used to characterize an individual subassembly of a lithography system, such as an illuminator for use in conjunction with a stepper or a scanner.

Accordingly, there exists a need in the art for an improved method and apparatus for characterizing the behavior of certain features of the lithographic equipment. There is a further need to compensate for the behavior variations of such equipment to improve integrated circuit manufacture.

SUMMARY OF THE INVENTION

According to one aspect of the invention, the invention is directed to a method for determining an illumination intensity profile of a projection lithography system across a plane corresponding to a desired wafer exposure location. The method can include placing an illumination profile mask in an illumination field defined by an illuminator, the illumination profile mask having a plurality of apertures and each aperture passing a distinct portion of radiation output by the illuminator; placing a sensor array within the illumination field to separately detect each distinct portion of the radiation; and constructing the illumination intensity profile from the detections of the sensor array.

According to another aspect of the invention, the invention is directed to a method for generating an illumination intensity profile of an illuminator, the illuminator forming a part of a projection lithography system. The method can include projecting radiation generated by the illuminator towards an illumination profile mask having a plurality of apertures such that each aperture passes a distinct portion of the radiation; detecting an intensity of each of the distinct portions of radiation; and assembling the illumination intensity profile from the detected intensities.

According to yet another aspect of the invention, the invention is directed to a system for generating an illumination intensity profile of an illuminator, the illuminator forming a part of a projection lithography system. The system can include an illuminator profile mask having a plurality of apertures and disposed in an illumination field of the illuminator such that each aperture passes a distinct portion of the radiation generated by the illuminator; and a sensor array having a photosensitive regions disposed in a measurement plane to separately detect an intensity of each of the distinct portions of radiation.

According to still another aspect of the invention, the invention is directed to a method of optical proximity correction (OPC) for an integrated circuit layout corresponding to a layer to be embodied in a wafer by a photolithographic technique. The method can include providing the layout; correcting the layout using an OPC routine to compensate for optical distortions predicted to be encountered as a result of variations contained within an illumination intensity profile of an illuminator, the illuminator forming a part of a projection lithography system; and outputting a corrected layout adapted for use in making a reticle.

BRIEF DESCRIPTION OF DRAWINGS

These and further features of the present invention will be apparent with reference to the following description and drawings, wherein.

DISCLOSURE OF INVENTION

Figure 1:
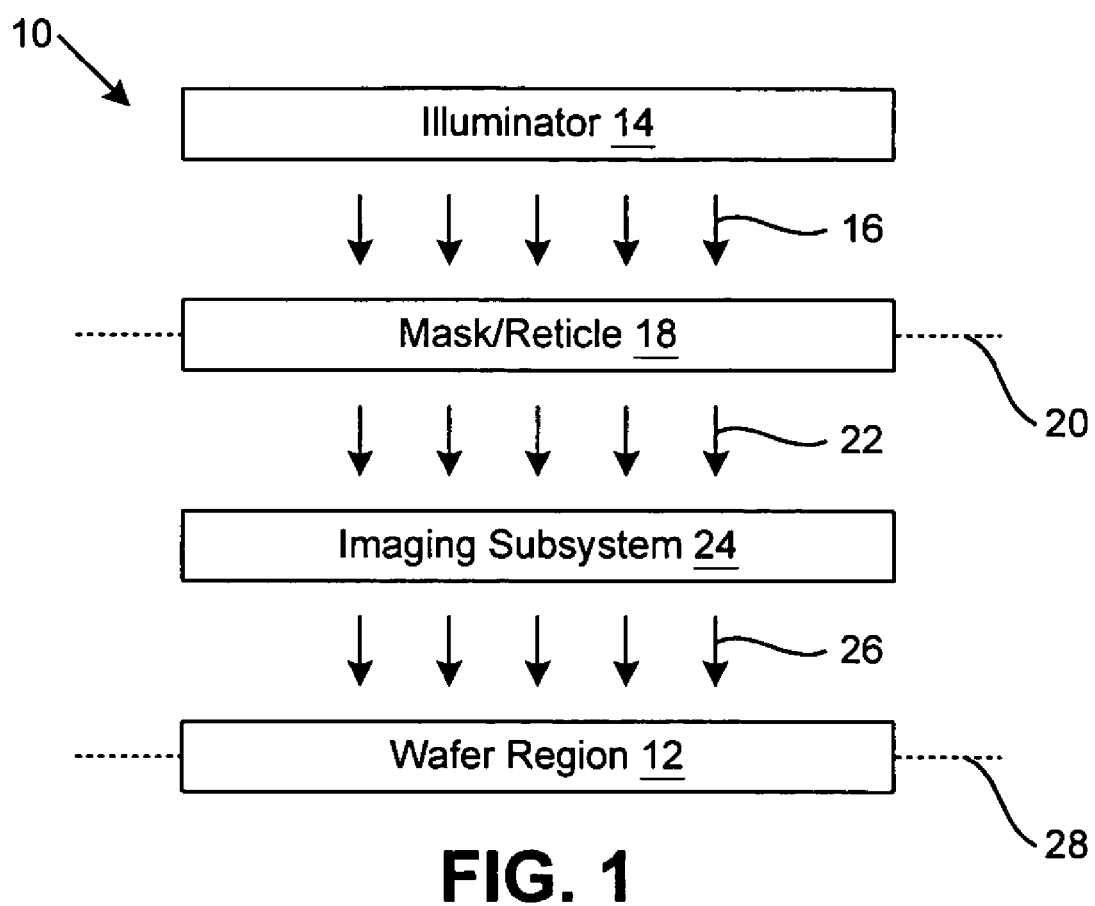
FIG. 1 is a schematic block diagram of an exemplary integrated circuit processing arrangement.

In the detailed description that follows, corresponding components have been given the same reference numerals, regardless of whether they are shown in different embodiments of the present invention. To illustrate the present invention in a clear and concise manner, the drawings may not necessarily be to scale and certain features may be shown in somewhat schematic form.

The present invention relates to a system for and a method of characterizing the behavior of an illuminator that is used as a radiation source for a lithographic imaging assembly. More specifically, the system and method are used to generate an illumination intensity profile (also referred to herein as a illuminator profile) of a lithographic processing assembly. Such an illumination intensity profile can be used, for example, to characterize cross-field image performance. In addition, a desired layout (e.g., corresponding to a layer of an integrated circuit) can be corrected using optical proximity correction (OPC) in a manner to at least partially compensation for distortions that are attributable to variations in the illuminator profile. Accordingly, the illuminator profile can be considered a model for distortions in the illuminator's output and can be used to predict distortions in the resulting pattern when the illuminator's output is passed through a reticle.

The present invention will be described in the exemplary context of the preparation process for the ultimate patterning a layer of material (e.g., a polysilicon gate or word line layer, a dielectric layer, a source/drain layer, a metal interconnect layer, a contact layer, etc.) that forms a part of an integrated circuit. Example integrated circuits include general use processors made from thousands or millions of transistors, a flash memory array or any other dedicated circuitry. However, one skilled in the art will appreciate that the methods, software tools and devices described herein can also be applied to the process of manufacturing any article made using photolithography, such as micromachines, disk drive heads, gene chips, micro electromechanical systems (MEMS) and so forth.

Referring to FIG. 1, illustrated is a schematic block diagram of an exemplary integrated circuit processing arrangement that includes a lithography system 10 used to image a pattern onto a wafer 12, or a region thereof. The system 10 can be, for example, a step-and-repeat ("stepper") exposure system or a step-and-scan ("scanner") exposure system, but is not limited to these example systems. The system 10 can include a radiation (e.g., light) source, or illuminator 14, for directing energy 16 towards a reticle 18. The illuminator 14 can be any type of illuminator 14 used in photolithographic processing, including, without limitation, illuminators designed for resolution enhancement. Resolution enhancement techniques (RET) can employ a multi-pole illuminator (e.g., dipole or quadrapole), an annular illuminator and so forth. The reticle 18 defines an optical reticle plane 20. The energy 16 can have, for example, a deep ultraviolet wavelength (e.g., about 248 nm or about 193 nm), or a vacuum ultraviolet (VUV) wavelength (e.g., about 157 nm), although other wavelengths, including extreme ultraviolet wavelengths, are possible.

The reticle 18 selectively blocks (or, in some instances, selectively reflects) the energy 16 such that an energy pattern 22 defined by the reticle 18 is transferred towards the wafer 12. An imaging subsystem 24, such as a stepper assembly or a scanner assembly, sequentially directs the energy pattern 22 transmitted by the reticle 18 to a series of desired locations on the wafer 12. The imaging subsystem 24 may include lenses and/or reflectors for use in scaling and directing the energy pattern 22 towards the wafer 12 in the form of an imaging energy pattern, or exposure dose 26. The exposure dose 26 can be focused onto an image plane 28 that is generally coincident with a location of the wafer 12 where the exposure dose is desired, which is herein referred to as a desired wafer exposure location. As should be appreciated, the image plane 28, at which best focus of exposure dose 26 can be directed, can be generally be coincident with an upper surface of the wafer 12 (e.g., the image plane corresponding to an upper surface of photo resist layer forming a part of the wafer such that the desired wafer exposure location is the upper surface of the combined photo resist layer, integrated circuit layers and substrate). Alternatively, the image plane 28 can be located under an upper surface of the wafer 12, such as within a photo resist layer to be exposed by the exposure dose 26. In other embodiments, the image plane 28 can be located above the actual wafer 12, including the photo resist layer to be exposed.

Figure 2:
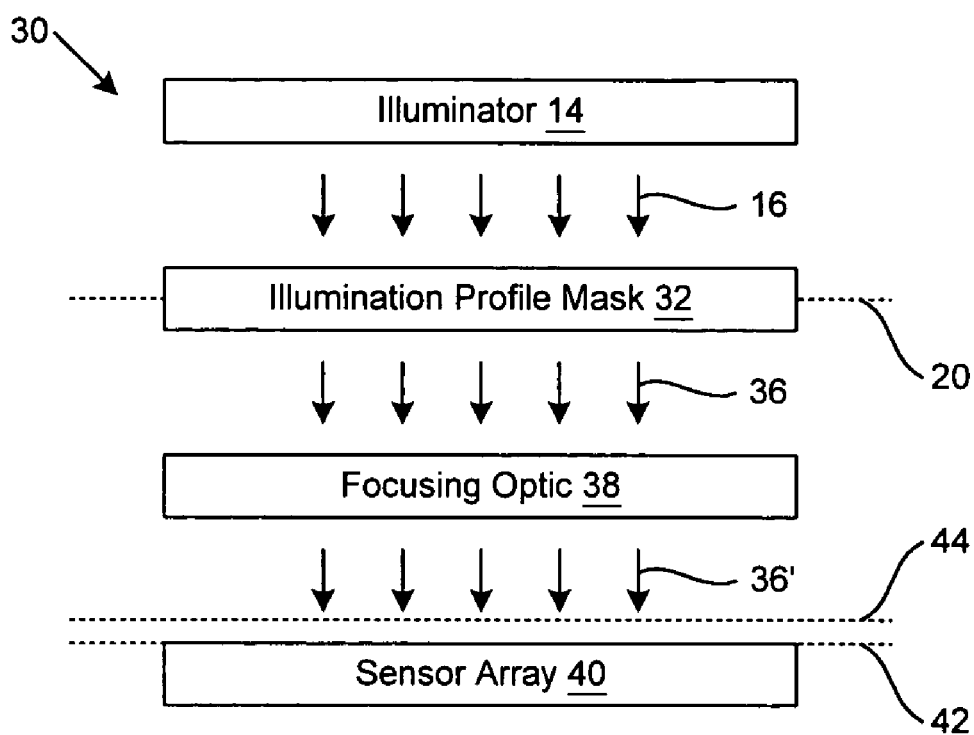
FIG. 2 is a schematic block diagram of a measurement assembly for characterizing of an illuminator component of the integrated circuit processing arrangement.

With additional reference to FIG. 2, shown is an exemplary measurement assembly 30 that can be used to characterize an illumination intensity profile output by the illuminator 14. The assembly 30 includes the illuminator 14. The illuminator directs energy 16 toward an illumination profile mask 32.

Figure 3:
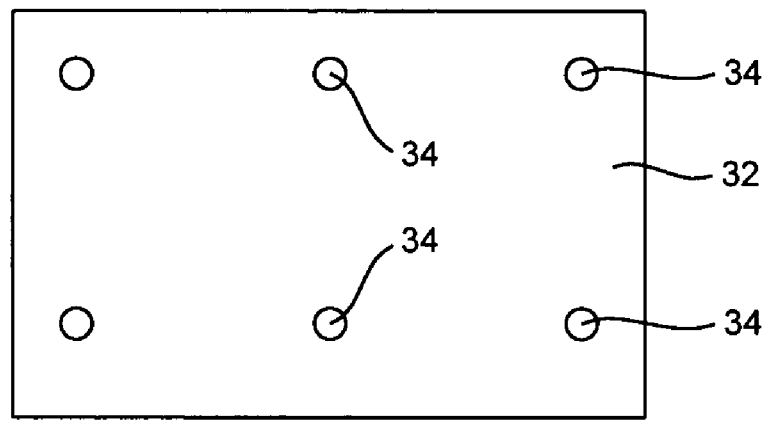
FIG. 3 is a portion of an illumination profile mask for use in characterizing the illuminator component.

With additional reference to FIG. 3, a portion of an example illuminator profile mask 32 is shown. The illuminator profile mask 32 can include a matrix of apertures 34, such as pinhole apertures. In one embodiment, the apertures 34 have a relative opening size and spacing from each other such that diffractive interference does not significantly effect the illumination intensity of radiation transmitted by any one of the apertures 34. For instance, the apertures 34 can have a diameter of about 10 micrometers (µm) and a pitch of about 1.0 millimeters (mm) in both an X direction and a Y direction. In one embodiment, the size of the apertures 34 is about 100 times smaller than the distance to any other aperture. In one embodiment, the diameter of the apertures 34 are about 10 µm to about 2,000 µm. As should be apparent, the size of the apertures 34 can be selected based on a desired amount of radiation that the system will integrate during an illuminator profile measurement.

The illuminator profile mask 32 can be made from a standard reticle mask blank, such as a mask blank having a quartz substrate and a chrome layer in which the apertures 34 are formed. Although the apertures 34 are illustrated as being round, the apertures 34 can have other shaped, including, for example, oval, rectangular, and so forth.

The illuminator profile mask 32 selectively blocks the energy 16 such that a test pattern 36 is transmitted by the illuminator profile mask 32. In one embodiment, the test pattern 36 comprises distinct portions of radiation derived from the energy 16. Each distinct portion of radiation can correspond to one of the apertures 34 of the illuminator profile mask 32.

The test pattern 36 can be passed through a focusing optic 38. The focusing optic 38 directs the test pattern 36 transmitted by the illuminator profile mask 32 toward a sensor array 40 in the form of a focused test pattern 36'. The region from the illuminator 14 to the sensor array 40 and through which the radiation emitted from the illuminator 14 traverses (e.g., as any of the energy 16, the test pattern 36 and focused test pattern 36') is considered an illumination field.

In one embodiment, the focusing optic 38 can be the imaging subsystem 24 of the lithography system 10 (FIG. 1). In another embodiment, the focusing optic 38 is comprised of one or more optical elements (e.g., lenses). In yet another embodiment, the focusing optic can include the imaging subsystem 24 and additional optical elements. In some situations it may be preferable to use a focusing optic 38 that is of very simple construction (e.g., one or more lenses) compared to the imaging subsystem 24 to minimize distortions introduced into the test pattern 36 during measurement. The behavior of the focusing optic 38 can be known (e.g., by conducting tests or from data provided by a vendor of the focusing optic 38). The results of the measurement of the illuminator profile can be adjusted to account for any distortions that may be introduced by the focusing optic 38, such as by executing a software routine that reduces or removes the distortions introduced by the focusing optic 38 from a detected radiation pattern.

In the illustrated embodiment, the illuminator profile is measured at a position that corresponds to the image plane 28, such as at the plane where the exposure dose 24 would be focused to expose the wafer 12 undergoing lithographic processing. Accordingly, detecting elements of the sensor array 40 are disposed within a measurement plane 42. Depending on the relationship of the desired focus with respect to the wafer 12 during lithographic processing, the measurement plane 42 at which the illuminator profile is measured can correspond in terms of relative physical location to an upper surface of the wafer 12, to a plane within the wafer 12 (e.g., within a photo resist layer) or to a plane above the wafer 12. As will become more apparent below, the location of the measurement plane 42 during characterization of the illumination intensity profile can be different than a test pattern image plane 44 of the measurement assembly 30. As discussed more fully below, measuring the illuminator profile at a position corresponding to the in-focus image plane 28 can include making the illumination profile mask 32 out of focus.

The sensor array 40 can be a photo sensor array and, in this embodiment, the detecting elements can be a plurality of photosensitive regions. As indicated, the test pattern 36, and thus the corresponding focused test pattern 36', can comprise distinct portions of radiation that correspond to the apertures 34 of the illuminator profile mask 32. In one embodiment, a distinct photosensitive region can be provided as part of the sensor array 40 for each of the distinct portions of radiation. In this manner, the intensity of the radiation transmitted by each aperture 34 can be individual measured. The individual measurements of the distinct portions of radiation can be assembled in the form of the illumination intensity profile such that variations in intensity across the illumination field can be known. In one embodiment, the assembled illumination field intensity profile for the illuminator 14 can be mapped as an aerial image. For example, a correlation can be made of the distinct portion of the illumination field passed by one of the apertures 34 to the illumination intensity measured on a corresponding distinct photosensitive region of the sensor array 40 on which such portion of the illumination field is projected. In one embodiment, measurement of the illumination incident upon the sensor array 40 is taken over a period of time, such as about 100 microseconds to about 100 milliseconds. For a stepper system, the integration time of the measurements can be relatively large since a stage retaining the sensor array 40 is periodically moved to scan the illuminator profile. For a scanner system, the stage is continuously moved, which tends to decrease integration time. However, by using multiple scans, the signal to noise ratio can be advantageously increased.

As indicated, the location of the measurement plane 42 during characterization of the illumination intensity profile can be different than a test pattern image plane 44 of the measurement assembly 30. The test pattern image plane 44 is a plane at which the image created by the illumination profile mask 32 is focused. In one embodiment, the focusing optic 38 is configured to have a relatively large positive defocus, thereby spacing the test pattern image plane 44 apart from the measurement plane 42. For example, the focusing optic 38 can focus the test pattern image plane 44 about 50 µm to about 5,000 µm from the measurement plane 42 of the sensor array 40. The amount of defocus can be related to aperture 34 size. In one example, the apertures 34 can have a diameter of about 30 µm and the focusing optic 38 can position the test pattern image plane 44 about 400 µm from the measurement plane 42 of the sensor array 40. In another example, the apertures 34 can have a diameter of about 1,500 µm and the defocus can be about 3,400 µm.

As should be apparent, by measuring the image intensity transmitted by the apertures 34 positioned at various locations in the reticle plane 20 of the illumination field, the illuminator profile across the illumination field can be established. Such a test can form part of a set of tests used to characterized the overall lithography system 10, the results of which can be used for purposes of tool control and/or lithography system 10 matching. The process of measuring the illuminator profile can be automated. In another embodiment, the function of the illuminator profile mask 32 can be carried out by a programmable aperture in the lithography system 10, such as a programmable aperture of a stepper component. Where the lithography system 10 includes a scanner, a software routine can be used to average the "static" illuminator profile described above along with a scan direction to create an illuminator profile for the scanner.

As indicated, optical proximity correction, or OPC, can be used to prepare a desired layout before the layout is embodied onto a reticle in an attempt to improve image fidelity when the reticle is used to image a wafer. In general, current OPC techniques involve executing an OPC software program with accompanying OPC scripts. The OPC program/scripts carry out a computer simulation that takes an initial data set having information relating the desired pattern and manipulates the data set to arrive at a corrected data set in an attempt to compensate for factors such as optical proximity effects and photo resist processing. Some of the more prevalent concerns include line end pullback, corner rounding and line-width variations. These concerns are largely dependent on local pattern density and topology. The reticle can then be made in accordance with the corrected data set. Briefly, the OPC process can be governed by a set of optical rules (e.g., "rule-based OPC" employing fixed rules for geometric manipulation of the data set), a set of modeling principles (e.g., "model-based OPC" employing predetermined behavior data to drive geometric manipulation of the data set) or a hybrid combination of rule-based OPC and model-based OPC.

Figure 4:
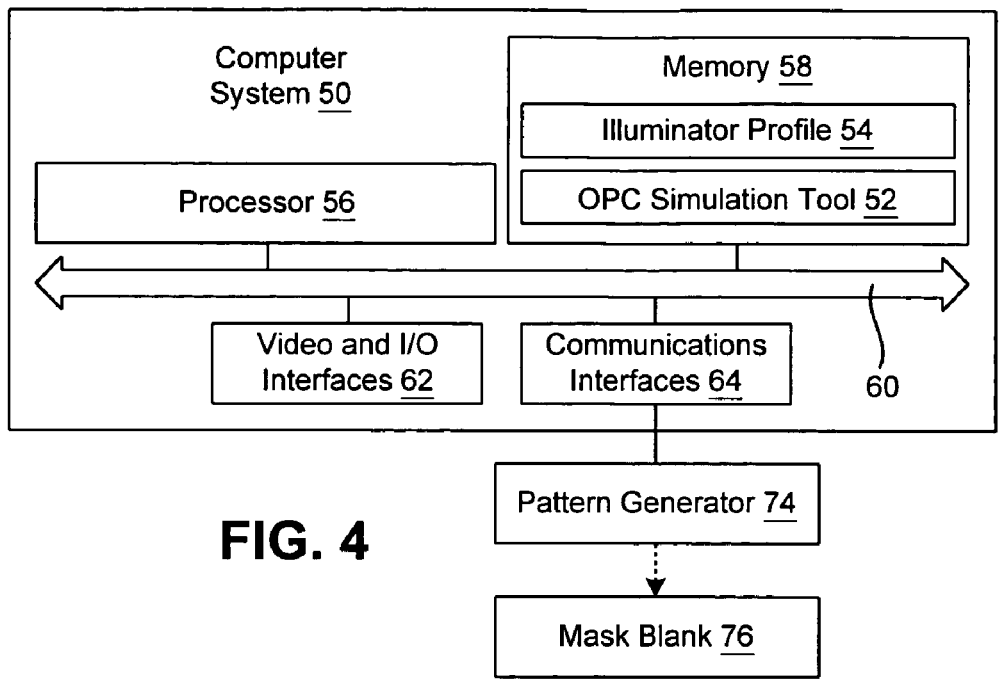
FIG. 4 is a computer system capable of executing an optical proximity correction (OPC) simulation tool.

With additional reference to FIG. 4, illustrated is a schematic block diagram of a computer system 50 capable of executing an OPC simulation tool 52 in accordance with aspects of the present invention. To assist in the OPC correction process, the computer system 50 can store an illuminator profile 54. The illuminator profile 54 can take any appropriate format, including, for example, scripts to be executed in conjunction with the OPC simulation tool 52, illuminator profile modeling data, OPC specifications, OPC rules, and combinations of these formats. In one embodiment, the OPC simulation tool 52 and/or the illuminator profile 54 are embodied in one or more computer readable formats, including, database structures, computer programs (e.g., one or more software applications including compilations of executable code), and the like. The computer readable formats can be embodied on a computer readable medium, such as a magnetic or optical storage device (e.g., hard disk, CD-ROM, DVD-ROM, etc.).

The illuminator profile 54 can be derived in any available manner, including, for example, the techniques described above that employs an illumination profile mask and a sensor assembly. Other techniques can include, for example, ray tracing programs that uses the design of the illuminator to simulate an illumination profile. Optionally, the illuminator profile 54 can be combined with information regarding the behavior of the imagining subsystem 24 to establish an imaging model for the illuminating system 10. As should be appreciated, the illuminator profile 54 and/or the imaging model for the illuminating system 10 contain the variations in illuminator intensity across the illumination field. As a result, an OPC correction model derived from the illuminator profile 54 and/or the imaging model will be dependent on illuminator field position. As will become more apparent below, when the OPC model is applied to spatially "flat" layout design data (e.g., design data that assumes no variations in illuminator intensity across the illumination field), the desired layout will receive field dependent OPC corrections. As a result, a more accurate reticle can be fabricated from the corrected data set.

To execute the OPC simulation tool 28 using the illuminator profile 54, the computer system 50 can include one or more processors 56 used to execute instructions that carry out a specified logic routine. In addition, the computer system 50 can have a memory 58 for storing data, software, logic routine instructions, computer programs, files, operating system instructions, and the like. The memory 58 can comprise several devices and includes, for example, volatile and non-volatile memory components. As used herein, the memory 58 can include, for example, random access memory (RAM), read-only memory (ROM), hard disks, floppy disks, compact disks (e.g., CD-ROM, DVD-ROM, CD-RW, etc.), tapes, and/or other memory components, plus associated drives and players for these memory types. The processor 56 and the memory 58 are coupled using a local interface 60. The local interface 60 can be, for example, a data bus with accompanying control bus, a network, or other subsystem.

The computer system 50 can have various video and input/output interfaces 62 as well as one or more communications interfaces 64. The interfaces 62 can be used to coupled the computer system 50 to various peripherals and networked devices, such as a display (e.g., a CRT display or LCD display), a keyboard, a mouse, a microphone, a camera, a scanner, a printer, a speaker and so forth. The interfaces 64 can be comprised of, for example, a modem and/or network interface card, and can enable the computer system 26 to send and receive data signals, voice signals, video signals, and the like via an external network, such as the Internet, a wide area network (WAN), a local area network (LAN), direct data link, or similar wired or wireless system.

The memory 58 stores an operating system (not shown) that is executed by the processor 56 to control the allocation and usage of resources in the computer system 50. Specifically, the operating system controls the allocation and usage of the memory 58, the processing time of the processor 56 dedicated to various applications being executed by the processor 56, and the peripheral devices, as well as performing other functionality. In this manner, the operating system serves as the foundation on which applications, such as the OPC simulation tool 52, depend as is generally known by those with ordinary skill in the art.

Figure 5:
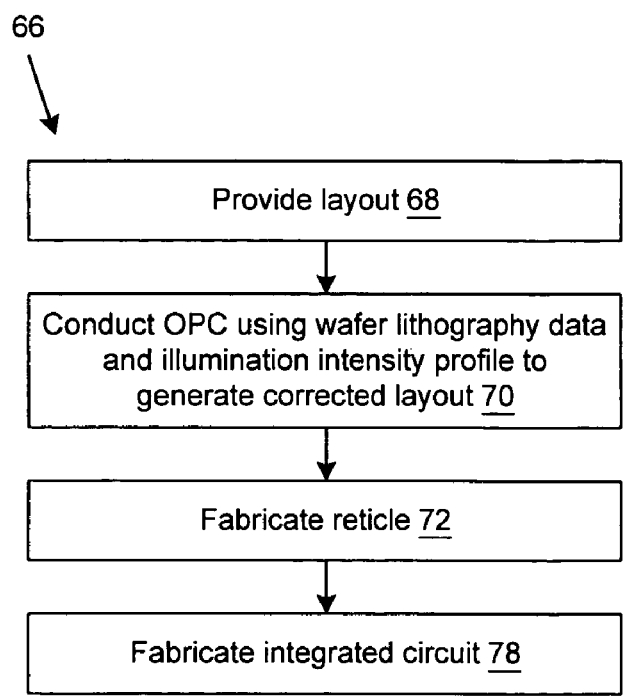
FIG. 5 is a high level flow chart of an example embodiment of the operation of the OPC simulation tool.

With additional reference to FIG. 5, shown is a flow chart of an example embodiment of the operation of the OPC simulation tool 52. The flow chart of FIG. 5 can be thought of as depicting steps of a method 66 implemented in the computer system 50.

The method 66, as specified by an embodiment of the OPC simulation tool 52, can begin in block 68 where a desired layout to be corrected is provided. The layout can be embodied in an electronic database and expressed in a format used to represent geometrical data, such as a GDSII file. Electronic files used to represent a layout are often referred to in the art as "technology files," or "tech files." Therefore, the electronic file for the desired layout provided in block 68 can be referred to as a design data tech file.

Thereafter, the method 66 can continue in block 70 where OPC is carried out on the desired layout to correct for distortions occurring during imaging of the wafer, including distortions caused by variations in the illuminator profile 54. Briefly, the OPC process can involve iteratively refining the desired layout using an edge placement error (EPE) value as a benchmark for the compensating process. For instance, the features and lines of the desired (or target) pattern are broken into edge fragments (or edge segments).

The fragmented data set is manipulated based on rules and/or models, and such that the data set receives field dependent OPC corrections to correction for specific variations contained in the illuminator profile 54. As part of the correction process, the edge fragments can be moved inward or outward. Then, a simulation can be run to determine predicted placement of the edges by simulated "imaging" (or "printing") of the manipulated pattern onto a wafer. The predicted edges are compared against their desired placement; and, when the simulation of the printing of the test pattern converges upon the desired layout with acceptable limits, the OPC routine can end. Upon completion, the OPC simulation tool can output a corrected pattern, such as in the form of a final mask tech file.

Thereafter, the method 66 can continue in block 72 where the layout defined by the final mask tech file can be used to fabricate a corresponding reticle. For example, the computer system 50 can transfer the final mask tech file to a pattern generator 74 (FIG. 4). In turn, the pattern generator 74 can write the pattern defined in the final mask tech file to a mask blank 76 (FIG. 4), which is then processed to form the final reticle using appropriate reticle manufacturing techniques. In one embodiment, the final mask tech file is transferred via the communication interface 64. In another embodiment, the final mask tech file is stored on a computer readable medium and loaded onto the pattern generator. Upon fabrication of the reticle fabricated in block 72, an integrated circuit can be fabricated in block 78 using the reticle of block 72 to image the wafer from which the integrated circuit is made. For example, the reticle can be loaded in the lithography system 10 and the wafer 12, which includes a photo resist layer, can be exposed with radiation generated by the illuminator 14. As is known in the art, additional processing can be carried out to develop the imaged photo resist and process the wafer as desired using the patterned photo resist as, for example, an etch mask or an implant mask.

During the integrated circuit fabrication, the same illuminator or type of illuminator for which corrections were made in block 70 should be employed to image the pattern of the reticle to the wafer. In this manner, an improved integrated circuit can be fabricated using techniques and tech file data that account for the illumination intensity profile 54.

As should be appreciated, variations to the method 66 are possible and those variations are intended to fall within the scope of the present invention. For instance, the OPC corrections to account for the illumination intensity profile can be made separately from conventional OPC corrections made for factors such as optical interference. In another alternative, the design data tech file can be "predistorted" (e.g., filtered) using a transfer function corresponding to the illumination intensity profile. Thereafter, the predistorted pattern data can be corrected using conventional OPC techniques.

It is noted that, in conventional fashion, OPC is often carried out for only a small region of a layout at a time. Although not illustrated in the flowcharts shown herein, one skilled in the art will understand that process loops can be included to sequentially process a layout by regions until all regions of the layout have individually been corrected in accordance with a set of OPC specifications.

Although embodiments of a method of conducting OPC using an illuminator profile 54 have been described and illustrated herein as following a specific order of steps, one skilled in the art will appreciate that variations to the method exist and these variations are intended to fall within the scope of the invention as defined by the claims appended hereto. For example, certain illustrated blocks and/or steps can be omitted. In addition, other blocks and/or steps can be added. The order of execution of various blocks and/or steps can be carried out in an order other than the order shown or described. Also, certain blocks and/or steps can be carried out concurrently or with partial concurrence.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method for determining an illumination intensity profile of a projection lithography system across a plane corresponding to a desired wafer exposure location, comprising:
   placing an illumination profile mask in an illumination field defined by an illuminator, the illumination profile mask having a plurality of apertures and each aperture passing a distinct portion of radiation output by the illuminator, wherein each aperture is sized and positioned with respect to the other apertures such that each distinct portion of radiation does not contain a significant diffractive interference component;
   placing a sensor array within the illumination field to separately detect each distinct portion of the radiation; and
   constructing the illumination intensity profile from the detections of the sensor array.

2. The method according to claim 1, wherein the sensor array includes a plurality of distinct photosensitive regions, each corresponding to a distinct portion of the radiation.

3. The method according to claim 1, further comprising placing a focusing optic within the illumination field between the illuminator and the sensor array.

4. The method according to claim 3, wherein the focusing optic includes an imaging subsystem of the lithography system.

5. The method according to claim 3, wherein the focusing optic includes at least one lens to impart a positive defocus to an image of the illumination profile mask.

6. The method according to claim 1, wherein each aperture has a size that is at least 100 times smaller than the distance to every other aperture.

7. The method according to claim 1, further comprising:
   providing an integrated circuit layout corresponding to a layer to be embodied in a wafer by a photolithographic technique; and
   correcting the layout using an optical proximity correction (OPC) routine to compensate for optical distortions predicted to be encountered as a result of variations contained within the constructed illumination intensity profile.

8. The method according to claim 7, further comprising:
   fabricating a reticle in accordance with the corrected layout; and
   fabricating an integrated circuit using the reticle to image a layer of photo resist material.

9. A method for determining an illumination intensity profile of a projection lithography system across a plane corresponding to a desired wafer exposure location, comprising:
   placing an illumination profile mask in an illumination field defined by an illuminator, the illumination profile mask having plurality of apertures and each aperture passing a distinct portion of radiation output by the illuminator;
   placing a sensor array within the illumination field to separately detect each distinct portion of the radiation; and
   constructing the illumination intensity profile from the detections of the sensor array, wherein illumination intensity of each distinct portion of radiation is measured over a period of time of about 100 microsecond to about 100 milliseconds.

10. A method for determining an illumination intensity profile of a projection lithography system across a plane corresponding to a desired wafer exposure location, comprising:
   placing an illumination profile mask in an illumination field defined by an illuminator, the illumination profile mask having a plurality of apertures and each aperture passing a distinct portion of radiation output by the illuminator;
   placing a sensor array within the illumination field to separately detect each distinct portion of the radiation;
   focusing an image of the illumination profile mask about 50 µm to about 5,000 µm spaced apart from a measurement plane of the sensor array; and
   constructing the illumination intensity profile from the detections of the sensor array.

11. A method for generating an illumination intensity profile of an illuminator, the illuminator forming a part of a projection lithography system, comprising:
   projecting radiation generated by the illuminator towards an illumination profile mask having a plurality of apertures such that each aperture passes a distinct portion of the radiation, wherein each aperture is sized and positioned with respect to the other apertures such that each distinct portion of radiation does not contain a significant diffractive interference component;
   detecting an intensity of each of the distinct portions of radiation; and
   assembling the illumination intensity profile from the detected intensities.

12. The method according to claim 11, further comprising positively defocusing an image of the illumination profile mask to be spaced apart from a measurement plane in which the detecting is carried out.

13. The method according to claim 11, wherein each aperture has a size that is at least 100 times smaller than the distance to every other aperture.

14. The method according to claim 13, further comprising:
provideng an integrated circuit layout corresponding to a layer to be embodied in a wafer by a photolithographic technique; and
correcting the layout using an optical proximity correction (OPC) routine to compensate for optical distortions predicted to be encountered as a result of variations contained within the illumination intensity profile.

15. The method according to claim 14, further comprising:
fabricating a reticle in accordance with the corrected layout; and
fabricating an integrated circuit using the reticle to image a layer of photo resist material.

16. A method for generating an illumination intensity profile of an illuminator, the illuminator forming a part of a projection lithography system, comprising:
projecting radiation generated by the illuminator towards an illumination profile mask having a plurality of apertures such that each aperture passes a distinct portion of the radiation;
detecting an intensity of each of the distinct portions of radiation; and
assembling the illumination intensity profile from the detected intensities, wherein:
the image of the illumination profile mask is spaced apart from the measurement plane by about 50 μm to about 5,000 μm.

17. A system for generating an illumination intensity profile of an illuminator, the illuminator forming a part of a projection lithography system, comprising:
an illuminator profile mask having a plurality of apertures and disposed in an illumination field of the illuminator such that each aperture passes a distinct portion of the radiation generated by the illuminator, wherein each aperture is sized and positioned with respect to the other apertures such that each distinct portion of radiation does not contain a significant diffractive interference component; and
a sensor array having a photosensitive regions disposed in a measurement plane to separately detect an intensity of each of the distinct portions of radiation.

18. The system according to claim 17, further comprising a focusing optic that is positioned in the illumination field to positively defocus an image of the illumination profile mask to be spaced apart from the measurement plane.

19. The system according to claim 17, wherein each aperture has a size that is at least 100 times smaller than the distance to every other aperture.

20. A system for generating an illumination intensity profile of an illuminator, the illuminator forming a part of a projection lithography system, comprising:
an illuminator profile mask having a plurality of apertures and disposed in an illumination field of the illuminator such that each aperture passes a distinct portion of the radiation generated by the illuminator; and
a sensor array having a photosensitive regions disposed in a measurement plane to separately detect an intensity of each of the distinct portions of radiation, wherein;
the image of the illumination profile mask is spaced apart from the measurement plane by about 50 μm to about 5,000 μm.

* * * * *